(12) United States Patent
Schultz et al.

(10) Patent No.: US 12,531,529 B2
(45) Date of Patent: Jan. 20, 2026

(54) REFERENCE TRANSISTOR CIRCUITS WITH NOISE SUPPRESSION

(71) Applicant: NXP USA, Inc., Austin, TX (US)

(72) Inventors: Joseph Gerard Schultz, Wheaton, IL (US); Yu-Ting David Wu, Schaumburg, IL (US); Michelle Nicole Corn, Phoenix, AZ (US); Ngai-Ming Lau, Fountain Hills, AZ (US); Thomas William Raimbault, Lockport, IL (US)

(73) Assignee: NXP USA, INC., Austin, TX (US)

( * ) Notice: Subject to any disclaimer, the term of this patent is extended or adjusted under 35 U.S.C. 154(b) by 321 days.

(21) Appl. No.: 18/488,957

(22) Filed: Oct. 17, 2023

(65) Prior Publication Data

US 2025/0125780 A1   Apr. 17, 2025

(51) Int. Cl.
  *H03F 3/24* (2006.01)
  *H03F 1/02* (2006.01)
  *H03F 1/26* (2006.01)

(52) U.S. Cl.
  CPC .......... *H03F 3/245* (2013.01); *H03F 1/0233* (2013.01); *H03F 1/26* (2013.01); *H03F 2200/294* (2013.01)

(58) Field of Classification Search
  CPC .......... H03F 3/45475; H03F 2200/451; H03F 3/45183; H03F 3/45179; H03F 3/195; H03F 3/45192; H03F 3/193; H03F 3/245; H03F 1/301; H03F 3/211; H03F 3/19; H03F 3/04; H03F 1/0205; H03F 2200/294

USPC ....................................................... 455/127.1
See application file for complete search history.

(56) References Cited

U.S. PATENT DOCUMENTS

| | | | |
|---|---|---|---|
| 10,608,595 B1 | 3/2020 | Maalouf et al. | |
| 12,119,300 B2 | 10/2024 | Kabir et al. | |
| 2015/0303878 A1* | 10/2015 | Sowlati | H03F 3/195 330/291 |
| 2024/0171140 A1* | 5/2024 | Tahara | H03F 3/195 |
| 2024/0405732 A1* | 12/2024 | Tahara | H03F 1/565 |
| 2024/0429871 A1* | 12/2024 | Tahara | H03F 1/565 |

OTHER PUBLICATIONS

Blair, Cindy, Ericsson RF Power Products; "Technical Feature—Biasing LDMOS FETs for Linear Operation"; Applied Microwave & Wireless; 3 pages (Jan. 2000).
Electrical Engineering; "What is the R-C Feedback to this FET?"; Sep. 1, 2020.

(Continued)

*Primary Examiner* — Ajibola A Akinyemi

(57) ABSTRACT

A reference transistor forms part of a measurement circuit coupled to bias control circuitry that is configured to operate a primary transistor at a desired operating point by providing appropriate DC bias voltages to the control terminal of the primary transistor and one or more current terminals of the primary transistor based upon an output of the measurement circuit generated using the reference transistor. A dissipative circuit element is electrically coupled to the reference transistor and is configured to cause the reference transistor to exhibit negative gain at a drain terminal (or other output node) of the reference transistor with respect to alternating-current (AC) electrical signals which may be unintentionally coupled to the gate (or other input node) of the reference transistor.

18 Claims, 5 Drawing Sheets

(56) References Cited

OTHER PUBLICATIONS

Motorola/Freescale Semiconductor, Inc.; AN1987—Quiescent Current Control for the RF Integrated Circuit Device Family; 8 pages (2004).

Motorola/Freescale Semicondutor, Inc.; "AN1643 Rf Ldmos Power Modules for GSM Base Station Application: Optimum Biasing Circuit"; Application Note; 2 pages (1998).

Motorola/Freescale Semicondutor, Inc.; "AN1977—Quiescent Current Thermal Tracking Circuit in the RF Integrated Circuit Family"; Semiconductor Application Note; 8 pages (2003).

\* cited by examiner

REFERENCE TRANSISTOR CIRCUITS WITH NOISE SUPPRESSION

TECHNICAL FIELD

Embodiments of the subject matter described herein relate to transistor circuits with feedback systems for automatic bias adjustment.

BACKGROUND

Transistor-based circuits such as amplifiers are often used for analog a signal processing applications including amplification of radio and microwave-frequency (RFMW) signals. In some such applications, such as wireless communication systems, it may be important to ensure that power levels at the output of one or more amplification stages are sufficient to ensure suitable signal-to-noise ratios and/or that such power levels do not exceed a maximum power level (e.g., in order to protect other circuitry from damage, and/or to ensure that a wireless signal does not exceed safety or regulatory limits).

In RFMW transistor amplifiers and related transistor circuits, constant (DC) bias voltages are chosen to bias a transistor circuit at a desired operating point along an operating curve that relates a signal level at an input of the transistor circuit to a signal level at the output of the transistor circuit. A time-varying (AC) input signal applied in addition to a DC input bias produces a corresponding AC variation in the output of the transistor circuit which may be separated into a DC component and an AC component (i.e., an amplified copy of the AC input signal). Some transistor circuits include additional biasing circuitry to help ensure proper biasing to achieve desired performance characteristics.

SUMMARY

In an example embodiment, a device includes a primary transistor having a first current terminal, a second current terminal, and a control terminal. The device also includes measurement circuitry and bias control circuitry.

The measurement circuitry includes a reference transistor and a dissipative circuit element electrically coupled to the reference transistor. The reference transistor has a first current terminal coupled to an output node of the measurement circuitry, a second current terminal, and a control terminal coupled to an input node of the measurement circuitry. The dissipative circuit element electrically is configured to cause the reference transistor to exhibit negative gain at the output node with respect to alternating-current (AC) electrical signals applied to the input node of the reference circuit for a predetermined range of signal frequencies.

The bias control circuitry configured to operate the primary transistor at a first operating point by: applying predetermined bias voltages to the current terminals of the reference transistor and the control terminal of the reference transistor; measuring a reference electrical current level flowing between the first current terminal and the second current terminal of the reference transistor; and applying bias voltages configured to operate the primary transistor at the first operating point that are derived from the reference electrical current level to the primary transistor.

In another example embodiment, a method includes forming a primary transistor having a first current terminal, a second current terminal, and a control terminal. The method further includes forming measurement circuitry. The measurement circuitry includes. a reference transistor having a first current terminal coupled to an output node of the measurement circuitry, a second current terminal, and a control terminal coupled to an input node of the measurement circuitry. The measurement circuitry also includes a dissipative circuit element electrically coupled to the reference transistor and configured to cause the reference transistor to exhibit negative gain at the output node with respect to alternating-current (AC) electrical signals applied to the input node of the reference circuit for a predetermined range of signal frequencies.

The method further includes electrically coupling the measurement circuitry to bias control circuitry. The bias control circuitry is configured to operate the primary transistor at a first operating point by: applying predetermined bias voltages to the current terminals of the reference transistor and the control terminal of the reference transistor; measuring a reference electrical current level flowing between the first current terminal and the second current terminal of the reference transistor; and applying bias voltages configured to operate the primary transistor at the first operating point that are derived from the reference electrical current level to the primary transistor.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
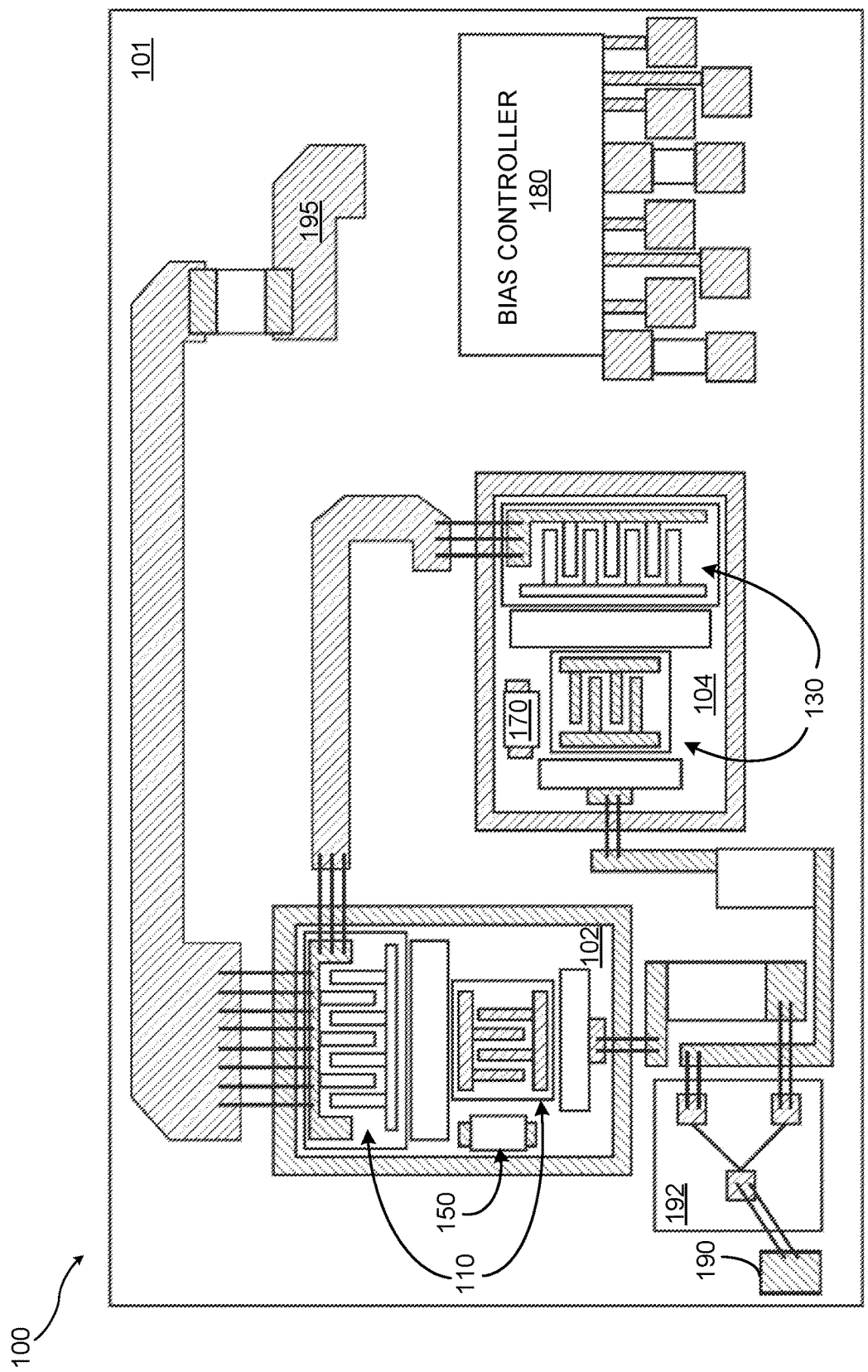
FIG. 1 is a plan-view schematic of an amplifier circuit including multiple semiconductor die and other components on a printed circuit board.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

Conventional transistor circuits are often subject to variations that can make it difficult or impossible to ensure that they are always operated at a desired operating point along an input-output transfer function of such circuits (e.g., such that output signal levels of the transistor circuit remains within a desired output amplitude range). For instance, in a radio-frequency and microwave (RFMW) amplifier circuit, a desired operating point may coincide with a set of DC bias voltages supplied to the control terminal and current terminals of one or more transistors such that a particular range of RFMW input signal amplitudes results in an amplified RFMW signal at the output that remains within a specified range of desired output signal amplitudes or that other performance specifications such as noise levels or distortion levels are satisfied. Non-limiting examples of variations to which transistor-based circuits are susceptible include differences in performance characteristics between nominally identical individual transistors that arise from semiconductor processing variations. Such variations may occur between individual die or wafers and/or between individual device dies on a single die or wafer. Other non-limiting examples include performance variations that arise from temperature-dependent electrical transport phenomena, device "aging," and other factors. Accordingly, some transistor-based circuits include additional "reference transistors" which may be used to detect and correct for undesired performance variations in associated "active" or "primary" transistors.

The use of reference transistors can be desirable to ensure stable operation of transistor-based circuits, including amplifier devices such as those described below in connection with FIG. 1 and FIG. 2, and related circuits, as non-limiting examples. In such applications, it can be desirable for reference transistors be placed as close possible to associated primary transistors and often on the same substrate (e.g., the same semiconductor die) in order to reduce manufacturing costs (by reducing the physical die size required to accommodate an primary transistor and a corresponding reference transistor) and/or to ensure that the conditions experienced by the primary transistor(s) are as close as possible to those experienced by the accompanying reference transistor(s). However, undesired effects may occur when reference transistors are placed in close proximity to primary transistors on a die. For example, AC input or output signals associated with the primary transistors may be coupled to reference transistors. In particular, if unwanted AC signals are coupled to the gate (or other control terminal) of a reference transistor, a reference signal (i.e., a current or voltage measurement signal) produced by the reference transistor may exhibit undesired fluctuations which can in turn cause undesired fluctuations in the biasing conditions of an associated primary transistor.

As an example, FIG. 1 shows a simplified plan view of an amplifier device 100 in which reference transistors according to embodiments herein may be utilized. The example amplifier device 100 shown is a Doherty amplifier configuration in which two amplifier circuits, typically referred to as a "carrier amplifier" (formed on a semiconductor die 102 in this example) and a "peaking amplifier" (formed on a semiconductor die 104 in this example) are both coupled to the same alternating current (AC) input node 190 (via power splitter 192 and other circuitry that provides impedance matching) and the same output node 195 in order to provide consistent AC output performance across a wide range of AC signal levels at the input. It will be understood that embodiments herein may be discussed in the context of the example amplifier device 100 and other devices for purposes of illustration only and that nothing herein is intended to limit embodiments to use in any particular amplifier circuit or other electronic device.

As shown, the example amplifier device 100 is constructed on a substrate 101 (e.g., a polymer substrate such as a printed circuit board or other suitable substrate) that includes the individual semiconductor die 102, 104 that are attached (e.g., soldered) to thermally- and electrically conductive die pads on the substrate 101. Terminals of the semiconductor dies are wire-bonded to conductive traces on the substrate 101. In this example, a first semiconductor die 102 (e.g., a peaking amplifier of a Doherty amplifier) includes one or more primary transistors 110 (i.e., transistors configured for use as amplifier transistors or other active device requiring controlled biasing to operate the transistor at a desired operating point) and suitable metal traces (not shown) electrically coupling the primary transistor(s) 110 to bond pads (e.g., terminals), which are in turn electrically coupled to conductive traces on the substrate 101 by wire bonds. The example amplifier device 100 also includes a second semiconductor die 104 (e.g., a main or carrier amplifier of a Doherty amplifier) with one or more additional primary transistors 130 that are similarly coupled to conductive traces on the substrate 101 via wire bonds. The amplifier device includes an input node 190.

As shown, each semiconductor die 102, 104 includes a respective reference device (reference transistors 150,170 in this example). In general reference devices may be thermistors, diodes, transistors, or other devices which produce electrical signals that can be measured by bias control circuitry (a bias controller 180) and used to adjust the biasing of each of the amplifier transistors 110,130. For instance, if the reference devices are thermistors, the bias controller 180 may provide a constant voltage across each thermistor and measure a resulting current which will fluctuate with temperature. It is desirable to place reference devices close to the amplifier transistors 110,130 such that they can be expected to experience the same temperature changes as those transistors. For certain applications the use of reference devices such as the transistors 150,170 is desirable because the reference transistors 150,170 may formed from similar materials and by way of similar processing steps as the primary transistors 110,130 such that changes in the behavior of the reference transistors 150,170 may be used to infer changes in the behavior of the primary transistors 110,130. These inferences may be used to adjust the biasing of the transistors active 110,130 to ensure they are operated at or near their desired operating points under changing conditions.

If unwanted AC signals are coupled to a reference transistor such as one of the reference transistors 110, 130 in an amplifier such as the amplifier device 100, the corresponding primary transistors (e.g., the transistor 150 or 170) may exhibit undesirable performance characteristics. As one example, the amplifier may exhibit gain characteristics that vary as a function of the input signal power (an effect referred to as dynamic gain expansion, or "DGE"). Furthermore, in some instances, this gain variation can be non-linear and can also vary as function of input signal frequency, leading to unpredictable amplifier performance for input signals with complicated and time-varying frequency spectra.

Figure 2:
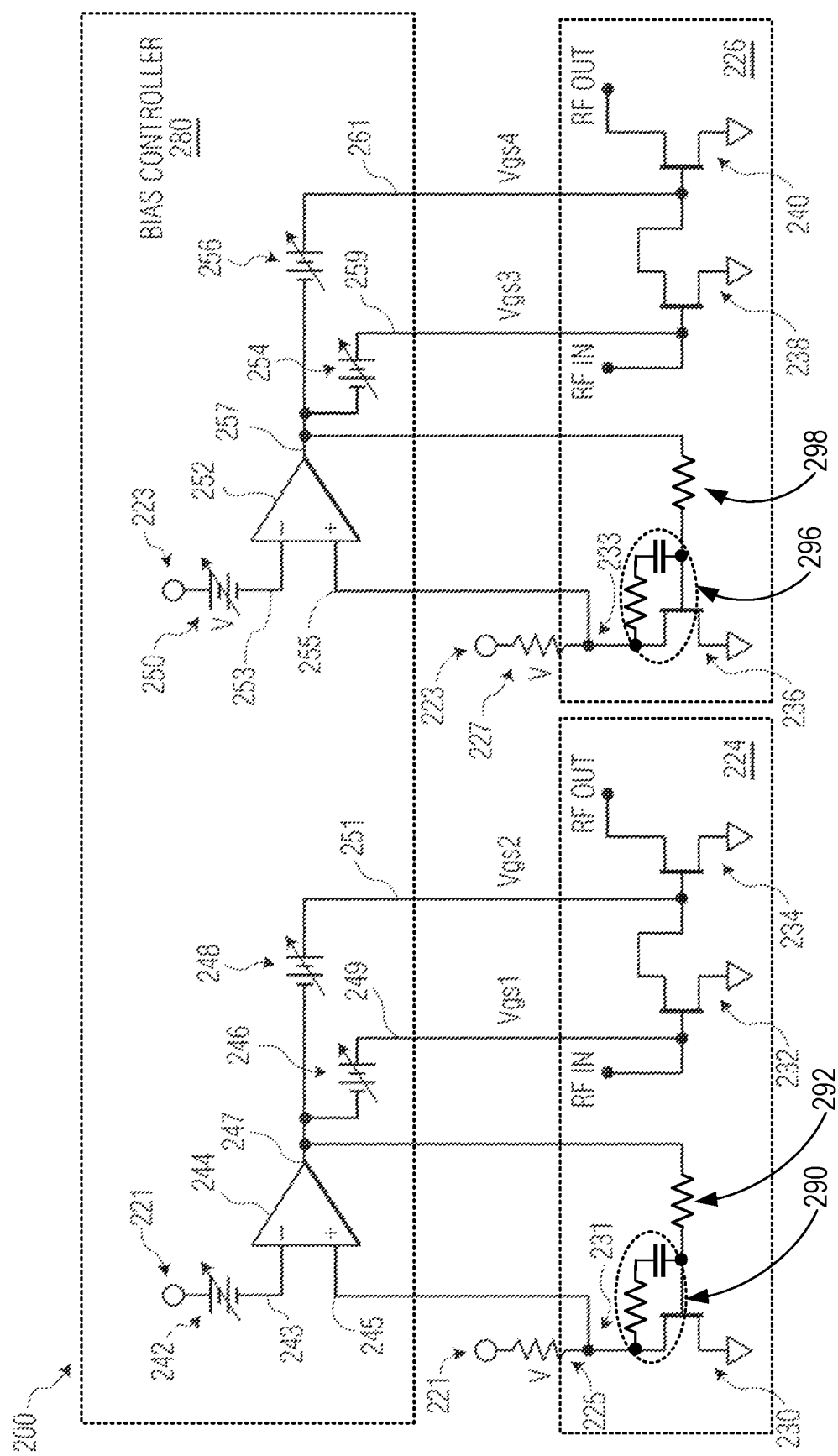
FIG. 2 is circuit diagram of an example amplifier system incorporating primary transistors and reference transistors according to one or more embodiments herein.

Accordingly, FIG. 2 is a circuit diagram of a portion of an example Doherty amplifier system 200 that incorporates reference transistors according to embodiments herein which are provided with additional circuit elements which can suppress coupling of unwanted AC signals to the reference transistors. FIG. 2 shows internal components of and interconnections between a dual stage peaking amplifier 224 (e.g., embodied in a die such as the semiconductor die 102 of FIG. 1), a first high tolerance drain resistor 225, a dual stage carrier amplifier 226 (e.g., embodied in a die such as the semiconductor die 104 of FIG. 1), a second high tolerance drain resistor 227, and a bias controller 280 (e.g., the bias controller 180 of FIG. 1). As shown, the dual stage peaking amplifier 224 includes a first reference transistor 230 (e.g., the reference transistor 150), a first preliminary-stage amplifier transistor 232 (e.g., a first one of transistors 110, FIG. 1), and a second final-stage amplifier transistor 234 (e.g., a second one of transistors 110, FIG. 1), and the dual stage carrier amplifier 226 includes a second reference transistor 236 (e.g., the reference transistor 170), a third preliminary-stage amplifier transistor 238 (e.g., a first one of transistors 130, FIG. 1), and a fourth final-stage amplifier transistor 240 (e.g., a second one of transistors 130, FIG. 1).

A reference transistor such as a reference transistor 230 or 236 can be integrally formed on a single integrated circuit die with one or more primary transistors such as one or more of the transistors 232, 234, 238, and 240 so that these reference transistors are matched with the primary transistors on the same integrated circuit die. In other words, manufacturing variations affecting the reference transistors may be expected to similarly affect the adjacent primary transistors. Similarly, temperature variations and other environmental factors including "aging" may be expected to similarly affect both the reference transistor(s) and adjacent primary transistors on the same die. In one or more embodiments, a reference transistor has dimensions determined according to a scaled relationship with one or more primary transistors on the same integrated circuit die. For example, in the context of FIG. 2 the first reference transistor 230 and the first transistor 232 may be sized to have a ratio between about 1:30 and about 1:10, and the first reference transistor 230 and the second transistor 234 may be sized to have a ratio between about 1:20 and about 1:50, although the ratios could be higher or lower, as well.

As shown in FIG. 2, the bias controller 280 includes a first programmable voltage source 242, a first comparator circuit 244, a first programmable digital to analog converter (DAC 246), a second programmable DAC 248, a second programmable voltage source 250, a second comparator circuit 252, a third programmable DAC 254, and a fourth programmable DAC 256. The first high tolerance drain resistor 225 is electrically coupled between the DC voltage source 221 and a current-carrying terminal (e.g., the drain) of the first reference transistor 230, and the second high tolerance drain resistor 227 is electrically coupled between a DC voltage source 223 and a current-carrying terminal (e.g., the drain) of the second reference transistor 236. In some embodiments, the first high tolerance drain resistor 225 and the second high tolerance drain resistor 227 may be coupled to the respective drains of the first and second reference transistors 230 and 236 through a connection to the bias controller 280.

A first (e.g., inverting) input 243 of the first comparator circuit 244 is electrically coupled to an output of the first programmable voltage source 242, a second (e.g., non-inverting) input 245 of the first comparator circuit 244 is electrically coupled to a current-carrying terminal (e.g., the drain) of the first reference transistor 230, and an output 247 of the first comparator circuit 244 is electrically coupled to the control input (e.g., the gate) of the first reference transistor 230 and respective inputs of each of the first and second programmable DACs 246 and 248. An output 249 of the first programmable DAC 246 is electrically coupled to the control input (e.g., the gate) of the first transistor 232, and an output 251 of the second programmable DAC 248 is electrically coupled to the control input (e.g., the gate) of the second transistor 234.

The first and second transistors 232, 234 are connected in a cascaded arrangement between the RF input (RF IN) and the RF output (RF OUT). More particularly, and as shown, the control terminal (e.g., the gate) of the first transistor 232 is electrically coupled to RF IN and one current-carrying terminal (e.g., the drain) of the first transistor 232 is electrically coupled to the control input (e.g., the gate) of the second transistor 234. A current-carrying terminal (e.g., the drain) of the second transistor 234 is electrically coupled to RF OUT (e.g., to the output node 195 of FIG. 1). The second current-carrying terminals (e.g., the sources) of the first and second transistors 232, 234 are shown being electrically connected to a ground reference.

As shown, the first (e.g., inverting) input 253 of the second comparator circuit 252 is electrically coupled to an output of the second programmable voltage source 250, a second (e.g., non-inverting) input 255 of the second comparator circuit 252 is electrically coupled to a current-carrying terminal (e.g., the drain) of the second reference transistor 236, and an output 257 of the second comparator circuit 252 is electrically coupled to the control input (e.g., the gate) of the second reference transistor 236 and respective inputs of each of the third and fourth programmable DACs 254 and 256. An output 259 of the third programmable DAC 254 is electrically coupled to the control input (e.g., the gate) of the third transistor 238, and an output 261 of the fourth programmable DAC 256 is electrically coupled to the control input (e.g., the gate) of the fourth transistor 240.

Similarly, the third and fourth transistors 238, 240 are connected in a cascaded arrangement between the RF input (RF IN, e.g., the input node 190 of FIG. 1) and the RF output (RF OUT, e.g., the output node 195 of FIG. 1). The control terminal (e.g., the gate) of the third transistor 238 is electrically coupled to RF IN and one current-carrying terminal (e.g., the drain) of the third transistor 238 is electrically coupled to the control input (e.g., the gate) of the fourth PA device 240. A current-carrying terminal (e.g., the drain) of the fourth transistor 240 is electrically coupled to RF OUT. The second current-carrying terminals (e.g., the sources) of the third and fourth transistors 238, 240 may be electrically connected to a ground reference. In this regard, it should be appreciated that, in the context of the example of FIG. 2 (and FIG. 1) in which the Doherty amplifier system 200 employs the dual stage carrier amplifier 226 that includes the third and fourth transistors 238 and 240, the control input of the third transistor 238 is the node at which a RF input signal is received by the cascaded arrangement of transistors for amplification by those devices. Additionally, the drain of the fourth transistor 240 is the node at which an RF output signal is output by the cascaded arrangement of transistors, with the RF output signal being an amplified version of the RF input signal after being amplified by those transistors.

The components coupled to the peaking amplifier 224 operate as follows. The first programmable voltage source 242 is configured to provide a first reference voltage at the input 43 of the first comparator circuit 244. The first reference voltage may be set to a value representing a desired voltage drop from the DC voltage source 221 across the first high tolerance drain resistor 225 that is indicative of a desired constant current flow amount through both the first high tolerance drain resistor 225 and a conductive channel (e.g., drain-to-source channel) of the first reference transistor 230. In one example, the first reference voltage provided to the input 243 of the first comparator circuit 244 is approximately 2.8 volts, although the first reference voltage could be higher or lower, as well. The first comparator circuit 244 compares the first reference voltage to the voltage at a node 231 (e.g. the voltage drop across the first high tolerance drain resistor 225) and adjusts an output voltage at the output 247 to attain a first stabilized voltage, which is provided to the control terminal (e.g., gate) of the first reference transistor 230. The first stabilized voltage induces the first reference transistor 230, via the control input of the first reference transistor 230, to drive the voltage drop across the first high tolerance drain resistor 225 to equal the first reference voltage. As an example, the first stabilized voltage may be approximately 2 volts, although the first stabilized voltage could be higher or lower, as well.

Once the first comparator circuit 244 produces the first stabilized voltage, the first programmable DAC 246 is configured to offset the first stabilized voltage by a first offset voltage to produce a first control voltage applied to the control input of the first transistor 232. As an example, the first offset voltage may be approximately 0.1 volts, although the first offset voltage could be higher or lower. The first control voltage may be approximately 1.9 volts, although the first control voltage could be higher or lower, as well. Likewise, the second programmable DAC 248 is configured to offset the first stabilized voltage by a second offset voltage to produce a second control voltage applied to the control input of the second transistor 234. As an example, the second offset voltage may be approximately 0.9 volts, although the second offset voltage could be higher or lower. The second control voltage may approximately 1.3 volts, although the second control voltage could be higher or lower, as well.

In the example of FIG. 2, the components coupled to the carrier amplifier 226 operate in a substantially similar manner to the components coupled to the peaking amplifier 224 discussed above. In particular, the second programmable voltage source 250 is configured to provide a second reference voltage at the input 253 of the second comparator circuit 252. The second reference voltage may be set to a value representing a desired voltage drop from the DC voltage source 223 across the second high tolerance drain resistor 227 that is indicative of a desired constant current flow amount through both the second high tolerance drain resistor 227 and a conductive channel (e.g., drain-to-source channel) of the second reference transistor 236. As an example, the second reference voltage provided to input 253 of the second comparator circuit 252 may approximately 2.8 volts, although the second reference voltage could be higher or lower, as well. The second programmable voltage source 250 may be the same component as the first programmable voltage source 242 or a separate component. If these components are the same, the second reference voltage will be equivalent to the first reference voltage. Otherwise if the voltage sources 242, 250 are distinct components, the first and second reference voltages could be equivalent or different from each other.

The second comparator circuit 252 compares the second reference voltage to the voltage at a node 233 (e.g., the voltage drop across the second high tolerance drain resistor 227), and adjusts an output voltage at the output 257 to attain a second stabilized voltage, which is provided to the control terminal (e.g., gate) of the second reference transistor 236. The second stabilized voltage induces the second reference transistor 236, via the control input of the second reference transistor 236, to drive the voltage drop across the second high tolerance drain resistor 227 to equal the second reference voltage. As an example, the second stabilized voltage may be approximately 2 volts, although the second stabilized voltage could be higher or lower, as well. After the second comparator circuit 252 produces the second stabilized voltage, the third programmable DAC 254 is configured to offset the second stabilized voltage by a third offset voltage to produce a third control voltage applied to the control input of the third transistor 238. As an example, the third offset voltage may be approximately 0.1 volts, although the third offset voltage could be higher or lower. As an example, the third control voltage is approximately 1.9 volts, although the third control voltage could be higher or lower, as well. Likewise, the fourth programmable DAC 256 is configured to offset the second stabilized voltage by a fourth offset voltage to provide a fourth control voltage applied to the control input of the fourth transistor 240. In some embodiments, the fourth offset voltage can be approximately 0.1 volts, although the fourth offset voltage could be higher or lower. As an example, the fourth control voltage maybe approximately 1.8 volts, although the fourth control voltage could be higher or lower, as well. The third programmable DAC 254 and the fourth programmable DAC 256 offset the second stabilized voltage to drive the third and fourth transistors 238 and 240. The first offset voltage and the third offset voltage can be preconfigured by adjusting control inputs of the first and second programmable DACs 256 and 254 to drive the third and fourth transistors 238 and 240 to operate along desired portions of their operating curves.

The third programmable DAC 254 and the fourth programmable DAC 256 may be configured to apply the third and fourth control voltages to the respective control inputs of the third transistor 238 and the fourth transistor 240 when a transceiver coupled to the amplifier system 200 is in a transmit state. The third control voltage provides a third bias (e.g., DC bias) voltage for a third RF signal applied to the control input (labeled "RF IN") of the third transistor 238 and the fourth control voltage provides a fourth bias (e.g., DC bias) voltage for a fourth RF signal applied to the control input of the fourth transistor 240. In the dual amplifier configuration of FIG. 2, the fourth RF signal is the output signal from the drain of the third transistor 238. The third and fourth bias voltages increase the DC voltage level(s) (DC component(s)) of the third and fourth RF signals, respectively, to level(s) that will induce the third and fourth transistors 238 and 240 to operate in their respective "active" (or "linear" regions) of their operating curves. When operating in these active regions, the third and fourth transistors 238, 240 operate to amplify the respective RF signals applied to the respective control inputs of the third and fourth transistors 238 and 240. In some embodiments, the third and fourth bias voltages can bias the third and fourth transistors 238, 240 to operate within desired output power ranges.

In amplifier system 200, the reference transistor 230 is provided with dissipative circuit elements to reduce unwanted coupling of AC signals (e.g., RF inputs or RF outputs of any of the transistors 232, 234, 238, or 240) to the input/control terminal (e.g., the gate) of the reference transistor 230. It will be understood that the dissipative circuit elements shown are non-limiting examples and that any suitable circuit elements and any suitable combinations thereof of may be used in embodiments herein. In the example of FIG. 2, the transistor includes a dissipative element 290 (e.g., a capacitance and resistance connected in series, as shown) coupled between the input/control terminal of the reference transistor 230 and the output node 231 (e.g., the drain of the reference transistor 230) which serves as an input to the bias controller 280. In this example, the reference transistor 230 is also coupled to an additional dissipative element 292 (e.g., a resistance coupled to the gate of the reference transistor 230). The reference transistor 236 as shown in FIG. 2 is provided with similar dissipative elements (i.e., the dissipative elements 296, shown as a resistance and a capacitance coupled between gate of the transistor 236 and the node 233 and the dissipative element 298, shown as a resistance coupled to the gate of the reference transistor 236).

Figure 3:
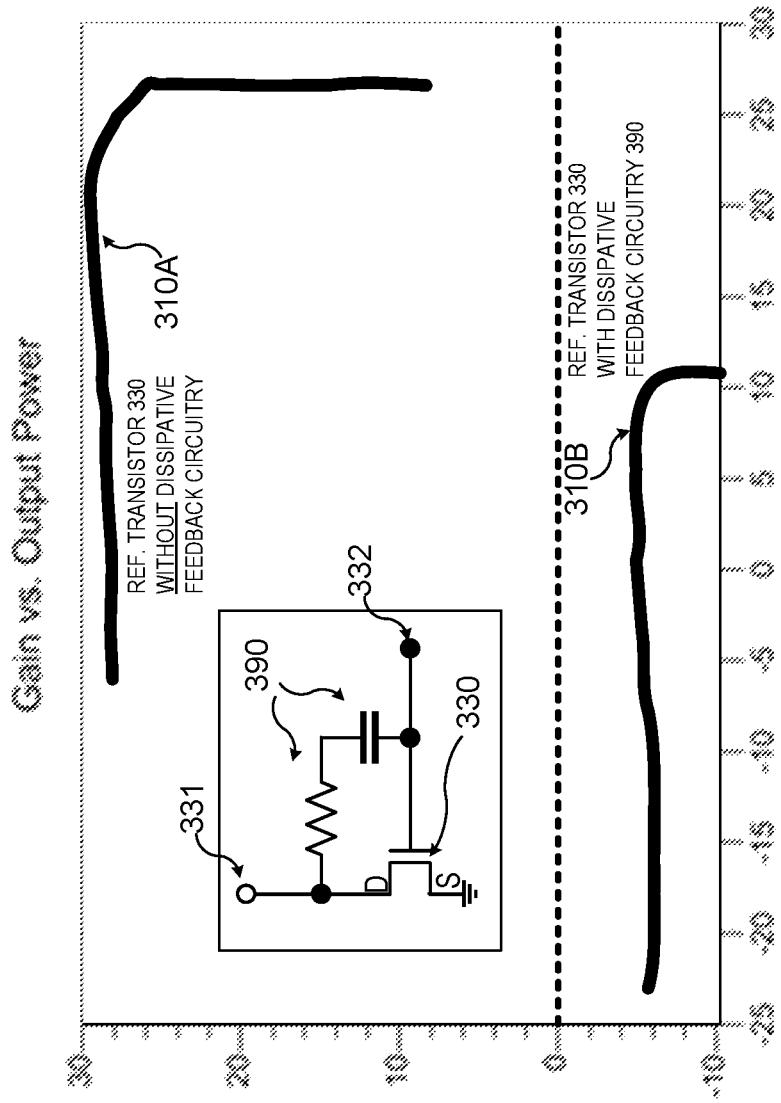
FIG. 3 is a graph illustrating gain vs. output characteristics of a reference transistor according to embodiments herein compared to a conventional reference transistor.

FIG. 3 shows a graph 300 illustrating the RF gain of a reference transistor 330 (e.g., a reference transistor 230 or a reference transistor 236) as a function of input signal power under two conditions. The transistor 330 is shown in the inset circuit schematic and has an input/control node 332 (e.g., the gate of the reference transistor 330) and an output node 331 (e.g., the drain of the reference transistor 330).

The curve 310A is a plot of the RF gain of the transistor at the output node 331 as a function of RF input power at the input/control node 332 under suitable biasing conditions. Input power is plotted logarithmically along the horizontal axis and output power is plotted logarithmically along the vertical axis of the graph 300. The curve 310A indicates that the reference transistor 330 exhibits positive gain of nearly 30 dB over a wide range of input powers before falling off as the reference transistor 330 enters saturation.

The curve 310B is an analogous plot of the RF gain of the reference transistor 330 at the output node 331 as a function of RF input power at the input/control node 332 under the same biasing conditions as in curve 310A. when suitable dissipative elements 390 (e.g., the dissipative elements 290 as shown in FIG. 2 coupled to the reference transistor 230 or the dissipative elements 296 as shown in FIG. 2 coupled to the reference transistor 236). It will be appreciated that the RF gain of the reference transistor along curve 310B is negative indicating that RF signals are attenuated by coupling the dissipative elements 390 to the reference transistor 330 as shown in FIG. 3.

The curves 310A, 310B correspond to performance of a representative semiconductor heterostructure field effect transistor (also known as a high electron mobility transistor or "HEMT"), with an operating drain-to-source voltage of 48V with a maximum operating power of approximately 500 milliwatts. In the example of FIG. 3, chosen component values of the dissipative elements 390 are shown (i.e., resistance and capacitance values of 500Ω and 0.2 pF). The dissipative elements 390 and similar arrangements can be referred to as feedback circuitry or feedback elements because they couple the output of the transistor to which they are connected (e.g., the reference transistor 330 or another transistor) to the input (i.e., the gate) of that transistor. For some applications it can be desirable to further increase the attenuation of unwanted RF signals at the input of a reference transistor such as the reference transistor 330 (i.e., to further reduce the RF gain of the reference transistor). Accordingly in one or more embodiments, the input/control node (i.e., the gate) of a reference transistor is coupled to a series resistance or other dissipative circuit element (see, for example, the dissipative element 292 depicted as a resistance coupled to the gate of the reference transistor 230 and/or the dissipative element 298 depicted as a resistance coupled to the gate of the reference transistor 236). As a non-limiting example, a resistance of approximately 2-5Ω in series with the input/control node (i.e., the gate) of reference transistors described herein can be sufficient to ensure that the input resistance of the reference transistor remains positive-valued on the Smith chart (i.e., signals reflected at the input do not experience positive gain, which can lead to instability in the reference transistor circuit).

It will be appreciated that appropriate component values (i.e., resistance values, capacitance values, and/or inductance values) for dissipative elements according to embodiments herein (including but not limited to dissipative elements such as the dissipative elements 290, 292, 296, 298, or 390) can be chosen to achieve desired operational characteristics. Generally, the values of dissipative elements should be chosen to ensure that circuit incorporating a particular reference transistor exhibits negative gain over the frequencies to which the reference transistor might be exposed (e.g., an operating frequency band of associated primary transistors. Using different dissipative elements together (e.g., elements that affect both the input impedance of a reference transistor and the output impedance of the reference transistor) can be used to reduce or eliminate instabilities that can arise from either or both of reflections at the input port of a reference transistor or reflections at the output port of a reference transistor circuit.

Thus, as illustrated above, the use of reference transistors can be desirable to ensure stable operation of transistor-based circuits, including amplifier devices such as those described above in connection with FIG. 1 and FIG. 2, and related circuits, as non-limiting examples. In such applications, it can be desirable for reference transistors be placed as close possible to associated primary transistors (e.g., primary transistors 110/130) on the same substrate (e.g., the same semiconductor die) in order to reduce manufacturing costs (by reducing the physical die size required to accommodate an primary transistor and a corresponding reference transistor) and/or to ensure that the conditions experienced by the primary transistor(s) are as close as possible to those experienced by the accompanying reference transistor(s). However, undesired effects may occur as described above when reference transistors are placed in close proximity to primary transistors on a die. Accordingly, FIG. 4 shows an example device in which a primary transistor and a reference transistor are formed within the same semiconductor substrate in close proximity and the reference transistor includes one or more dissipative elements to mitigate coupling of unwanted RF interference from the primary transistor to the reference transistor.

Figure 4:
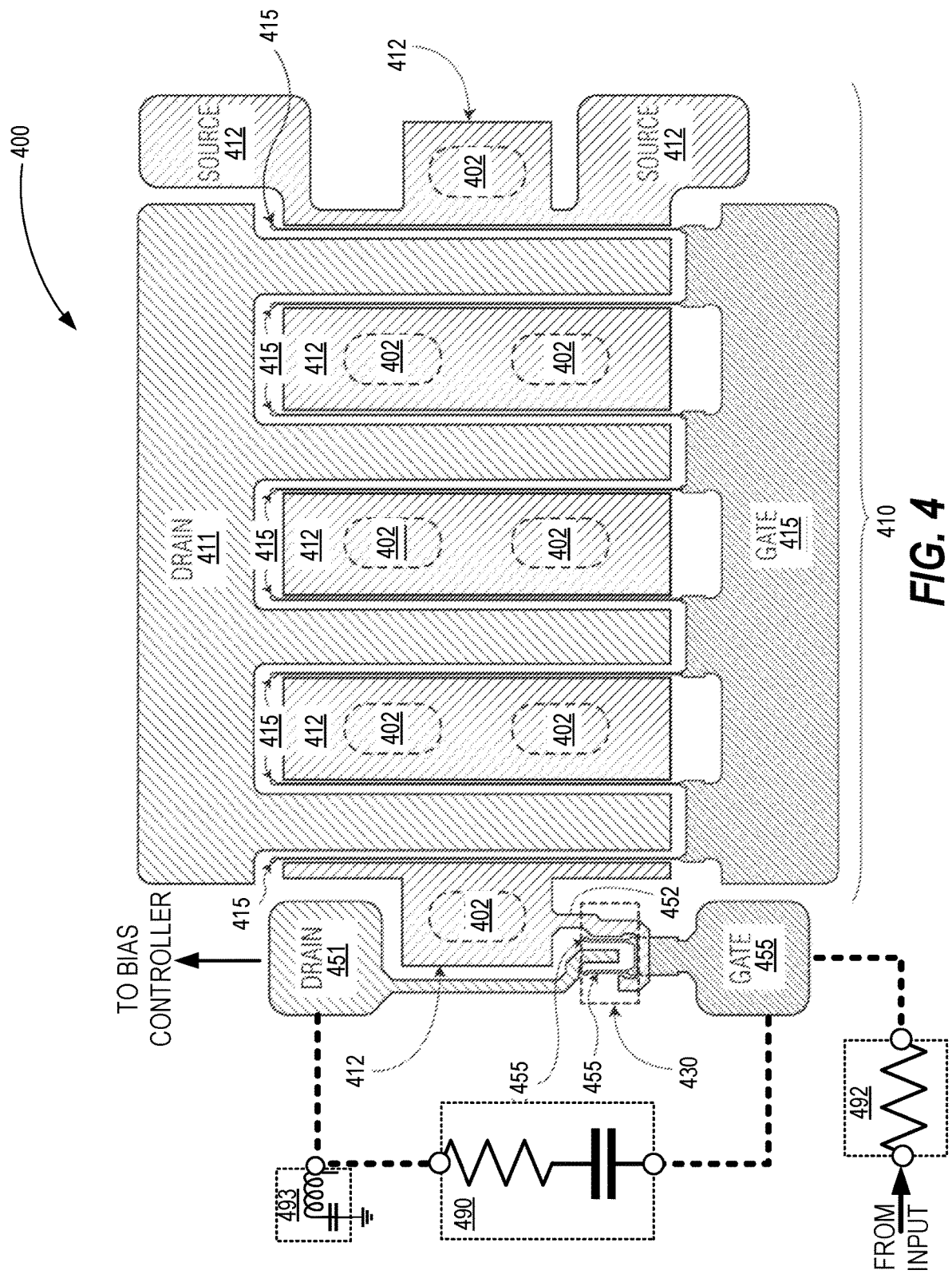
FIG. 4 shows a plan-view layout of a power transistor and an accompanying reference transistor according to one or more embodiments herein.

FIG. 4 is a plan view depicting the top surface of a device substrate (e.g., a semiconductor die) with an example device 400 that includes a primary transistor 410 and a reference transistor 430. In the example of FIG. 4, the primary transistor 410 is a power transistor that has an input/control terminal (represented by a gate metallization area 415, which may be a first bond pad) coupled to elongated gate structures of the primary transistor 410, an output node (represented by a drain metallization area 411, which may be a second bond pad) coupled to elongated drain contacts of the primary transistor 410, and a source metallization area 412 coupled to elongated source contacts of the primary transistor 410 and to source vias 402, which extend through the semiconductor substrate to provide a ground reference. The elongated gate structures, drain contacts, and source contacts are interdigitated. The reference transistor 430 has a drain metallization area 451, which may be a third bond pad, coupled to a drain contact or other equivalent current terminal of the transistor 430, and a gate metallization area 455, which may be a fourth bond pad, coupled to gate structure(s) of the reference transistor 430.

While placement of a reference transistor on the same die as a primary transistor as shown in FIG. 4 is often desirable, the arrangement of the transistors 410, 430 shown in FIG. 4 and similar arrangements can have disadvantages as described above. For instance, although the combined area required for the transistors 410, 430 may be optimized, the proximity of the gate metallization area 455 of the reference transistor 430 to the gate metallization area 415 of the primary transistor 410 may result in undesirable capacitive coupling of signals applied to the control terminal of the primary transistor 410 to the control terminal of the reference transistor 430. For example, if the primary transistor 410 is configured for use in an alternating current (AC) amplifier, AC signals may be applied to the gate metallization area 415 as input signals. When the primary transistor 410 is properly biased, small time-varying changes in the bias applied to the gate metallization area 415 may be amplified at the drain metallization area 411 of the primary transistor 410. Meanwhile, the reference transistor 430 may be biased by direct-current (DC) voltage or current signals applied to the gate metallization area 455.

The output of the reference transistor 430 coupled to the drain metallization area 451 may form the input to bias control circuitry (e.g., bias control circuitry 180 or 280) used to bias the primary transistor 410 at its desired operating point(s). However, if AC signals applied to the gate metallization area 415 are electromagnetically and/or capacitively coupled to the gate metallization area 455, an additional AC signal may be unintentionally applied to the gate metallization area 455 of the reference transistor 430. Such undesired application of AC signals to the gate metallization area 455 can in turn result in undesired fluctuations in biasing voltages or currents applied to the primary transistor 410 when the reference transistor 430 is used as described in connection with FIG. 2 or in related applications in which measurement of a current or voltage signal produced by the reference transistor 430 is used to ensure correct biasing of the primary transistor 410.

Accordingly, along the lines of previous explanations, dissipative elements according to embodiments herein can be coupled to a reference transistor such as the reference transistor 430 of FIG. 4. The dissipative elements 490 (e.g., dissipative elements 290, 296, or 290) and the dissipative element 492 (e.g., dissipative elements 292, or 298) are depicted schematically in FIG. 4 and can be coupled to a reference transistor such as the reference transistor 430 as shown. In one or more embodiments, additional dissipative elements (e.g., dissipative elements 493) can be coupled to a reference transistor such as the reference transistor 430 as shown.

In one or more embodiments, one or more dissipative elements such as one or more dissipative elements 490,492, or 493 can be integrally formed within the same semiconductor substrate as a reference transistor such as the reference transistor 430 to which they are coupled. It will be appreciated that such dissipative elements may be formed in any suitable manner, which may depend on the underlying transistor technology used to form the reference transistor. As an example, a reference transistor such as the reference transistor 430 may be formed as a HEMT within a semiconductor heterostructure in which a two-dimensional electron gas ("2 DEG") formed at a buried semiconductor interface can be used as an electronically controllable semiconductive channel. In such a device, a resistive element (e.g., the resistance pictured as part of the dissipative elements 490 or the resistance pictured as the dissipative element 492) can be integrally formed within the substrate by one or more areas where the 2 DEG forms surrounded by other areas which have been patterned to prevent formation of the 2 DEG and to instead behave as a dielectric. Similarly, a capacitor may be formed by one or metal structures (including but not limited to contact pads such as the metallization forming the drain metallization area 451 and/ or the gate metallization area 455.

In one or more embodiments one or more dissipative elements such as the dissipative elements 490 are coupled between an input/control node of a reference transistor such as the reference transistor 430 and an output node of the reference transistor as shown in FIG. 4 (i.e., in a "feedback" arrangement). In one or more embodiments a dissipative element such as the dissipative element 492 is coupled to an input/control node (or gate) of a reference transistor such as the reference transistor 430 as shown in FIG. 4. In some such embodiments, both types of dissipative elements are coupled to a reference transistor such as the reference transistor 430 as shown in FIG. 4.

In one or more embodiments, dissipative elements such as the dissipative elements 493 may be coupled between an output node of a reference transistor such as the reference transistor 430 and a reference potential (e.g., between the drain of the reference transistor 430 and the source of the reference transistor 430 or any other reference potential node). In the example of FIG. 4, the dissipative elements 493 are depicted as a series combination of an inductance and a capacitance, but it will be understood that any suitable dissipative elements may be chosen. It will be understood that, in one or more embodiments, the values of various components may be chosen to exhibit a desired impedance over one or more desired frequency ranges (e.g., the range of operating frequencies of an associated amplifier circuit in which the reference transistor is incorporated).

It will be further appreciated that dissipative elements depicted in the Figures and described herein are intended as non-limiting examples only. For example, any appropriate combination of resistive (R), inductive (L), and capacitive (C) elements may be employed. Along these lines, dissipative elements according to embodiments herein can be configured to provide attenuation of AC signals across all frequencies or a wide frequency range (e.g., resistive or predominantly resistive elements) and dissipative elements according to embodiments herein may be configured to provide attenuation of AC signals in a particular frequency range or ranges (e.g., RC, LC, and RLC circuit elements).

In addition, in one or more embodiments, a reference transistor such as the reference transistor 430 may be partially surrounded by a metallization area coupled to a reference potential ("ground") terminal interposed between the reference transistor and an adjacent such as the primary transistor 410 as shown in FIG. 4. In such embodiments, this grounded metallization area between the two transistors can provide additional (partial) shielding of the reference transistor from unwanted coupling of AC signals within the primary transistor the input/control node of the reference transistor.

Figure 5A:
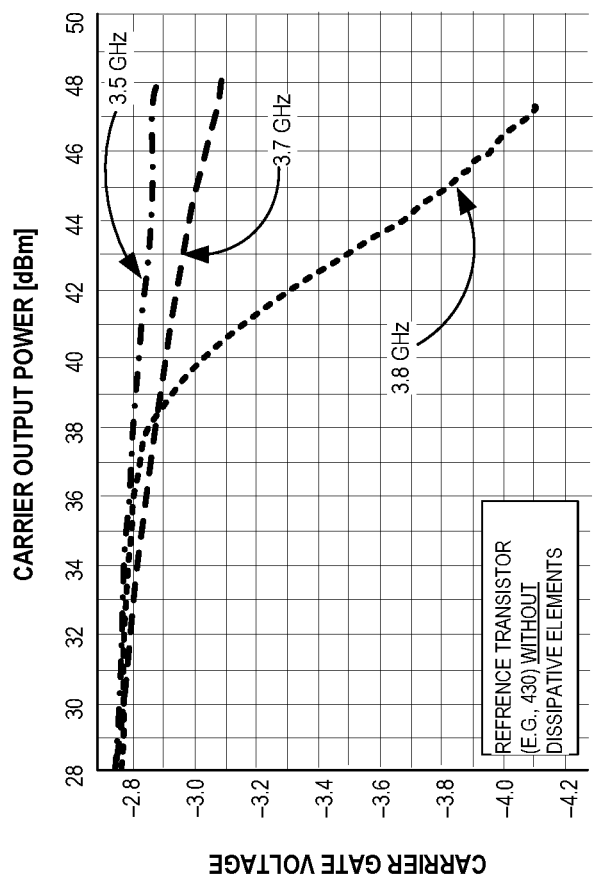
FIG. 5A is a graph showing a family of curves illustrating performance characteristics of an amplifier device controlled by bias control circuitry based on the output from a conventional reference transistor.
Figure 5B:
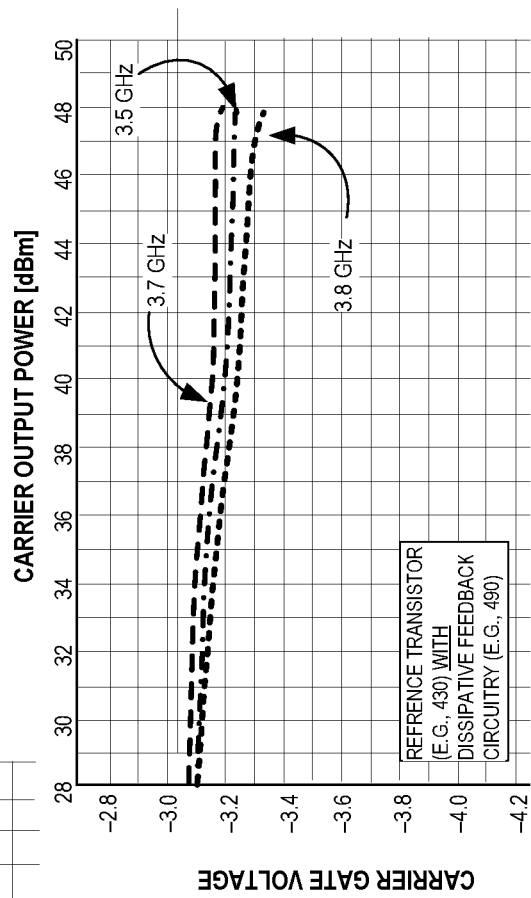
FIG. 5B shows a family of curves illustrating performance characteristics of an amplifier device similar to the amplifier device of FIG. 5A when the amplifier is controlled by bias control circuitry based on the output of a reference transistor according to one or more embodiments herein.

FIG. 5A and FIG. 5B illustrate performance improvements in a device that includes a reference transistor such as the reference transistor 430 and a primary transistor such as the transistor 410 in which the reference transistor forms part of measurement circuit with an output coupled to bias control circuitry (e.g., bias control circuitry 180 or 280) which controls biasing of the primary transistor based on the output of the measurement circuit. FIG. 5A shows a family of three curves illustrating example gate voltages applied to a carrier amplifier circuit (e.g., one or more primary transistors operating as part of a carrier amplifier) by bias control circuit such as the bias control circuitry 180 or 280 based on the output of the reference when the reference transistor is not coupled to dissipative elements such as the dissipative elements 490 or 492 for different output power levels of the carrier amplifier circuit. Each curve represents performance of the carrier amplifier at a different frequency. As shown, the carrier amplifier exhibits significant output-power dynamic gain expansion and the DGE can vary significantly with the signal frequency.

Meanwhile FIG. 5B shows a family of three curves illustrating example gate voltages applied to a similar carrier amplifier circuit by similar bias control circuitry when the reference transistor is couped to dissipative elements coupled to the reference transistor in a feedback configuration (i.e., as "feedback circuitry") such as the dissipative elements 490 as shown in FIG. 4. It will be appreciated that the DGE is significantly reduced compared to FIG. 5B and that the DGE exhibits much less variation with varying signal frequency. Furthermore, the separation between the three curves in FIG. 5B has been exaggerated at higher power levels to allow the individual curves to be seen.

It will be understood that nothing in the foregoing examples is intended to limit the geometry of devices according to embodiments herein and that the device geometries shown are non-limiting examples of suitable arrangements of a primary transistor and a shielded reference transistor with source terminals (or any other equivalent current terminals) coupled to a common reference voltage node including, but not limiting to a ground plane buried within a semiconductor substrate.

VARIOUS EXAMPLES

Features of embodiments may be understood by way of one or more of the following examples:

Example 1: A device or method that includes a primary transistor having a first current terminal, a second current terminal, and a control terminal; measurement circuitry; and bias control circuitry. The bias control circuitry configured to operate the primary transistor at a first operating point by: applying predetermined bias voltages to the current terminals of a reference transistor and a control terminal of the reference transistor; measuring a reference electrical current level flowing between a first current terminal and the second current terminal of the reference transistor; and applying bias voltages configured to operate the primary transistor at the first operating point that are derived from the reference electrical current level to the primary transistor.

The measurement circuitry includes the reference transistor which has its first current terminal coupled to an output node of the measurement circuitry and a control terminal coupled to an input node of the measurement circuitry. A dissipative circuit element is electrically coupled to the reference transistor and configured to cause the reference transistor to exhibit negative gain at the output node of the measurement circuitry with respect to alternating-current (AC) electrical signals applied to the input node of the reference transistor for a predetermined range of signal frequencies.

Example 2: The device or method of Example 1, where the dissipative circuit element is electrically coupled to the first current terminal of the reference transistor.

Example 3: The device or method of Example 1 or Example 2, where the dissipative circuit element is electrically coupled to input terminal of the reference transistor.

Example 4: The device or method of any of Examples 1-3 where the dissipative circuit element is electrically coupled between the control terminal of the reference transistor and the first current terminal of the reference transistor.

Example 5: The device or method of any of Examples 1-4, where the dissipative circuit element comprises a resistive element and a capacitive element electrically coupled between the control terminal of the transistor and the output node of the measurement circuitry.

Example 6: The device or method of any of Examples 1-5 where the dissipative circuit element comprises a resistive element coupled between the input node of the measurement circuitry and the control terminal of the reference transistor.

Example 7: The device or method of any of Examples 1-6, where the reference transistor is integrally formed within a semiconductor substrate and the dissipative circuit element is also integrally formed within the semiconductor substrate.

Example 8: The device or method of any of Examples 1-7, where the primary transistor is integrally formed within a semiconductor substrate and the reference transistor is also integrally formed within the semiconductor substrate.

Example 9: The device or method of any of Examples 1-8, where the primary transistor is a high-electron mobility transistor (HEMT) formed within a semiconductor heterostructure.

Example 10: The device or method of any of Example 9, where at least a portion of the dissipative circuit element is formed by a two dimensional electron gas formed at an interface of the semiconductor heterostructure.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A device, comprising:
    a primary transistor having a first current terminal, a second current terminal, and a control terminal;
    measurement circuitry that comprises:
    a reference transistor having a first current terminal coupled to an output node of the measurement circuitry, a second current terminal, and a control terminal coupled to an input node of the measurement circuitry; and
    a dissipative circuit element electrically coupled to the reference transistor and configured to cause the reference transistor to exhibit negative gain at the output node with respect to alternating-current (AC) electrical signals applied to the input node of the reference circuit for a predetermined range of signal frequencies; and
    bias control circuitry configured to operate the primary transistor at a first operating point by:
    applying predetermined bias voltages to the current terminals of the reference transistor and the control terminal of the reference transistor;
    measuring a reference electrical current level flowing between the first current terminal and the second current terminal of the reference transistor; and
    applying bias voltages configured to operate the primary transistor at the first operating point that are derived from the reference electrical current level to the primary transistor.

2. The device of claim 1, wherein the dissipative circuit element is electrically coupled to the first current terminal of the reference transistor or the dissipative circuit element is electrically coupled to input terminal of the reference transistor.

3. The device of claim 2, wherein the dissipative circuit element is electrically coupled between the control terminal of the reference transistor and the first current terminal of the reference transistor.

4. The device of claim 3, wherein the dissipative circuit element comprises a resistive element and a capacitive element electrically coupled between the control terminal of the transistor and the output node of the measurement circuitry.

5. The device of claim 2 wherein the dissipative circuit element comprises a resistive element coupled between the input node of the measurement circuitry and the control terminal of the reference transistor.

6. The device of claim 1, wherein the reference transistor is integrally formed within a semiconductor substrate and the dissipative circuit element is also integrally formed within the semiconductor substrate.

7. The device of claim 1, wherein the primary transistor is integrally formed within a semiconductor substrate and the reference transistor is also integrally formed within the semiconductor substrate.

8. The device of claim 7, wherein the primary transistor is a high-electron mobility transistor (HEMT) formed within a semiconductor heterostructure.

9. The device of claim 8, wherein at least a portion of the dissipative circuit element is formed by a two dimensional electron gas formed at an interface of the semiconductor heterostructure.

10. A method, comprising:
forming a primary transistor having a first current terminal, a second current terminal, and a control terminal;
forming a measurement circuitry comprising:
a reference transistor having a first current terminal coupled to an output node of the measurement circuitry, a second current terminal, and a control terminal coupled to an input node of the measurement circuitry; and
a dissipative circuit element electrically coupled to the reference transistor and configured to cause the reference transistor to exhibit negative gain at the output node with respect to alternating-current (AC) electrical signals applied to the input node of the reference circuit for a predetermined range of signal frequencies; and
electrically coupling the measurement circuitry to bias control circuitry configured to operate the primary transistor at a first operating point by:
applying predetermined bias voltages to the current terminals of the reference transistor and the control terminal of the reference transistor;
measuring a reference electrical current level flowing between the first current terminal and the second current terminal of the reference transistor; and
applying bias voltages configured to operate the primary transistor at the first operating point that are derived from the reference electrical current level to the primary transistor.

11. The method of claim 10, further comprising electrically coupling the dissipative circuit element to the first current terminal of the reference transistor or electrically coupling the dissipative circuit element to the input terminal of the reference transistor.

12. The method of claim 11, wherein the dissipative circuit element is electrically coupled between the control terminal of the reference transistor and the first current terminal of the reference transistor.

13. The method of claim 12, wherein the dissipative circuit element comprises a resistive element and a capacitive element electrically coupled between the control terminal of the transistor and the output node of the measurement circuitry.

14. The method of claim 11 wherein the dissipative circuit element comprises a resistive element coupled between the input node of the measurement circuitry and the control terminal of the reference transistor.

15. The method of claim 10, wherein the reference transistor is integrally formed within a semiconductor substrate and the dissipative circuit element is also integrally formed within the semiconductor substrate.

16. The method of claim 10, wherein the primary transistor is integrally formed within a semiconductor substrate and the reference transistor is also integrally formed within the semiconductor substrate.

17. The method of claim 16, wherein the primary transistor is a high-electron mobility transistor (HEMT) formed within a semiconductor heterostructure.

18. The method of claim 17, wherein at least a portion of the dissipative circuit element is formed by a two dimensional electron gas formed at an interface of the semiconductor heterostructure.

* * * * *